United States Patent [19]
Weidel

[11] 3,774,080
[45] Nov. 20, 1973

[54] ELECTRICAL CONNECTION SYSTEM

[75] Inventor: Vaughn Weidel, Aloha, Oreg.
[73] Assignee: Tektronix, Inc., Beaverton, Oreg.

[22] Filed: Sept. 13, 1971
[21] Appl. No.: 179,841

[52] U.S. Cl. .................... 317/101 CC, 317/101 CM, 317/101 DH, 339/17 LC
[51] Int. Cl. .................... H05k 1/04
[58] Field of Search .................... 339/17 LC, 17 M, 339/17 LM, 19; 317/101 D, 101 DH, 101 CC

[56] References Cited

UNITED STATES PATENTS 3,270,251 8/1966 Evans .................... 317/101 DH
3,179,913 4/1965 Mittler et al. .................... 317/101 D
3,184,700 5/1965 Burke et al. .................... 339/19 X

OTHER PUBLICATIONS

"Continental Connector, Taper Pin Terminal Blocks," Electronic Design, Sept. 17, 1958, p. 17, (DeJur-Amsco Corp.).

*Primary Examiner*—David Smith, Jr.
*Attorney*—Adrian J. La Rue et al.

[57] ABSTRACT

A electrical connection system encludes aligned electrical receptacles disposed on a first member, aligned elecrical receptacles disposed on a second member, and pin members disposed at spaced intervals in a dielectric carrying member which mate with the receptacles when aligned thereby electrically connecting them together.

4 Claims, 2 Drawing Figures

INVENTOR:
VAUGHN WEIDEL

BY: Adrian J. LaRue

ATTORNEY

ELECTRICAL CONNECTION SYSTEM

BACKGROUND OF THE INVENTION

Interconnection systems are known for connecting the electrical circuitry of several circuit-carrier members to the circuitry of a single circuit-carrier member and this is commonly accomplished by the use of female electrical connectors comprising housings having electrical contacts disposed therein for electrical engagement with conductive pads on printed circuit boards. The female connectors are generally mounted on a single printed circuit board and the electrical contacts are connected to electrical circuitry thereon or the female connectors are parallelly mounted on a mounting member and the electrical contacts are interconnected by point-to-point wiring techniques.

Instead of conductive pads, the conductive paths on daughter printed circuit boards can be connected to male or female contacts which mate with male or female contacts on a mother printed circuit board to interconnect electrical circuitry therebetween.

Electrical circuitry between printed circuit boards can be also interconnected by mating male and female connectors as printed circuit boards are mounted together. Electrical cables are frequently used to connect electrical circuits between printed circuit boards.

The electrical interconnection systems as described hereinabove do not provide for electrically eliminating selective circuitry on printed circuit boards without having to physically move the boards. They also do not provide for individual boards to be removed from confining positions without moving adjacent boards or parts.

The present invention overcomes these drawbacks by defining an electrical connection system whereby electrical connector members are disposed on adjacent printed circuit boards and spaced pin members carried in a dielectric member electrically mate with aligned electrical connector members electrically connecting electrical circuits on the printed circuit boards, maintaining the printed circuit boards in contiguous positions and permitting isolation of selected electrical circuits by removing predetermined pin member carriers.

A primary object of the present invention is to provide an electrical connection system for selectively connecting or isolating electrical circuits on printed circuit boards, without physically moving the printed circuit boards.

Another object of the present invention is the provision of an electrical connection system for maintaining printed circuit boards in position while making electrical connection with electrical circuits therebetween.

A further object of the present invention is to provide an electrical connection system whereby printed circuit boards can be electrically disconnected from one or more printed circuit boards without moving adjacent parts.

BRIEF DESCRIPTION OF THE DRAWINGS

Other objects and advantages of the present invention will be apparent from the following detailed description of preferred embodiments thereof and from the attached drawings of which:

With reference to FIG. 1, printed circuit boards 1, 2 and 3 contain on each side thereof electrical circuitry and conductive paths 4 therefor. Electrical components for forming electrical circuitry are not shown on boards 1–3 since it is not deemed essential to show them. Boards 1 and 3 may be mounted in position within an instrument housing or the like in any suitable manner. Electrical receptacles 5 are electrically connected to respective conductive paths 4 within openings in the printed circuit boards 1 and 3 by conventional flow-soldering techniques, and these receptacles are located on exterior surfaces of these boards and they are disposed substantially normal thereto. The sections of receptacles 5 that fit within the board openings provide openings through the boards after the receptacles have been soldered to the respective conductive paths. Electrical receptacles 6 are provided with tabs 7 extending outwardly from each end thereof and at substantially right angles thereto and these tabs 7 are flow-soldered within openings in board 2 to conductive paths 4 thereof. Electrical receptacles 6 extend substantially parallel with respect to board 2 and their axes are in alignment with respective axes of receptacles 5 on boards 1 and 3 when board 2 is positioned therebetween.

Figure 1:
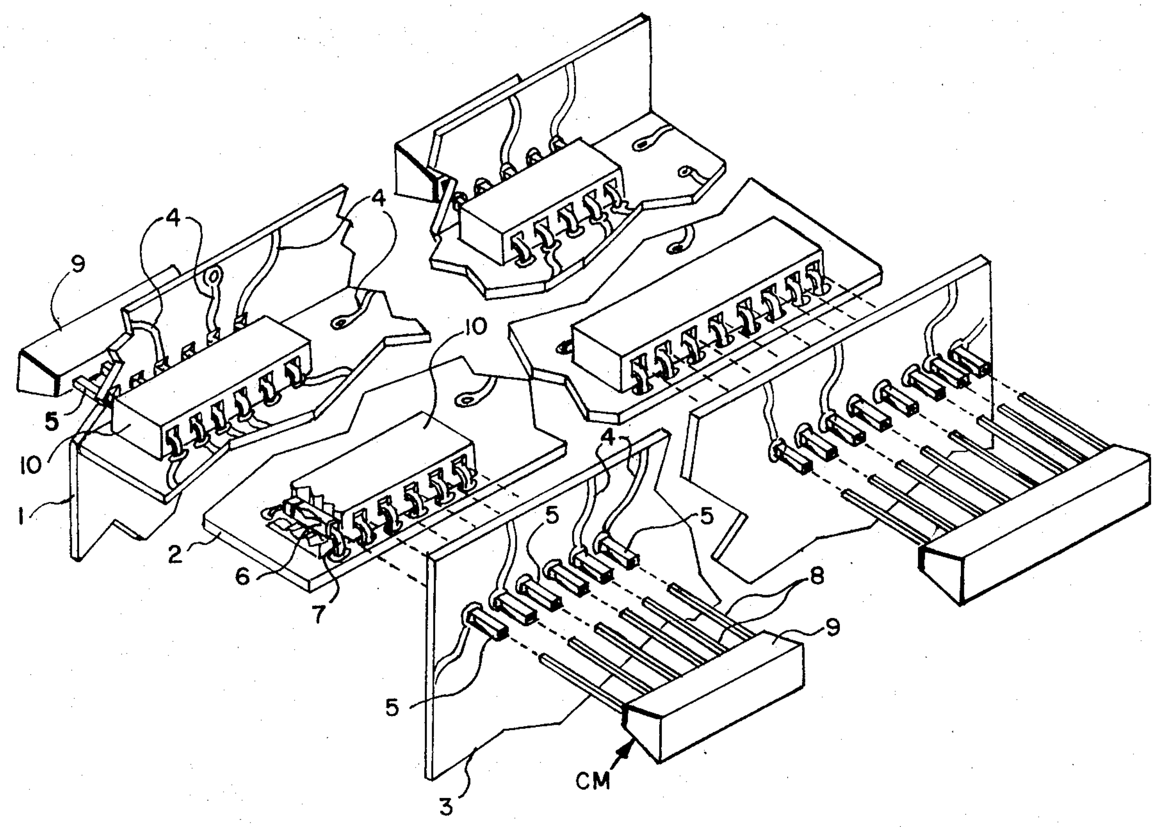
FIG. 1 is an exploded perspective view of the electrical connection system showing one way to electrically connect electrical circuits between printed circuit boards.

Electrical receptacles 5 and 6 have a box-shaped configuration with opposing sides having inwardly-directed spring contact members stamped out from these sides. They can, of course, have any desirable configuration to accomplish the intended purpose.

When board 2 is positioned between boards 1 and 3 with receptacles 5 and 6 in proper alignment, pins 8 are electrically mated with these receptacles thereby forming electrical connections between the electrical circuits on boards 1, 2 and 3. Pins 8 are secured, as by molding, in dielectric carrier 9 which is a suitable plastic such as, for example, nylon or the like. The pins 8 are properly spaced in carrier 9 to define a comb-shaped contact member CM and so that they are readily inserted within aligned receptacles 5 and 6. Depending upon the number of aligned receptacles will determine the length of the carrier and pins disposed therein Carrier 9 can be any desired length with pins 8 therein and it can be cut to provide any number of pins 8 therein depending upon the number of grouped receptacles to be interconnected.

Contact members CM are used to electrically connect receptacles 5 and 6 together to interconnect the electrical circuitry on boards 1, 2 and 3 by providing power and signal sources therebetween thereby eliminating extra circuits, cables and connectors, to isolate circuits or boards in a selective manner without physically moving the boards so that circuits or boards can be checked while the rest of an instrument is functioning and to maintain demountable boards in position.

In FIG. 1, board 2 can be mounted in position in an instrument housing and boards 1 and 3 can be demountably connected thereto by means of contact members CM although all boards may be mounted in position in the instrument housing with contact members CM making electrical contact therebetween via aligned receptacle contacts 5 and 6. While only one board 2 has been illustrated as being interposed between boards 1 and 3, it is to be understood that more boards may be disposed therebetween using alignable receptacle contacts 5 and 6 and contact members CM to interconnect the electrical circuits therebetween.

If desired, dielectric housings 10 having spaced openings therethrough for housing receptacles 6 therein may be provided in order to properly position receptacles 6 so that the tabs 7 thereof will be properly aligned with corresponding openings in board 2 so that they can be easily positioned thereon. The entrances to the receptacle openings provide guide means to facilitate guiding pins 8 into the receptacles and therefore allow for some misalignment between receptacles 5 and 6.

Figure 2:
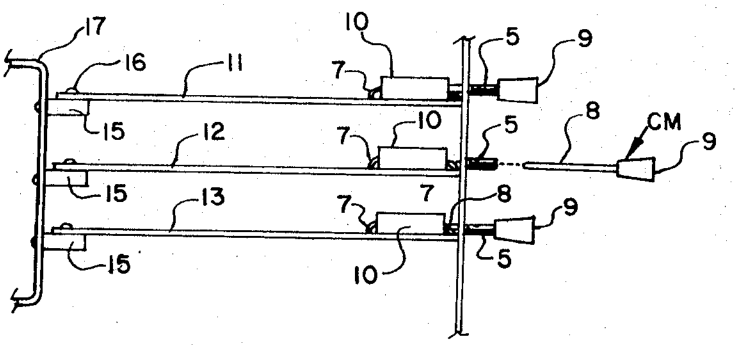
FIG. 2 is a top plan view showing another way to electrically connect electrical circuits between printed circuit boards by the electrical connection system.

FIG. 2 illustrates printed circuit boards 11, 12 and 13 having one end secured to mounting members 15 via screws 16 or the like and mounting members 15 extend outwardly from member 17 which can be part of an instrument chassis. Tabs 7 of receptacles 6 within housings 10 are mounted on boards 11–13 and connected to electrical circuitry thereon. Electrical receptacles 5 are mounted on board 14 so as to be alignable with receptacles 6 and connected to appropriate electrical circuitry of board 14. Pins 8 of contact members CM are inserted within aligned receptacles 5 and 6 to electrically connect same and the electrical circuitry on boards 11–14. Contact members CM and receptables 5 and 6 constitute electrical connection means for electrically connecting the electrical circuits on boards 11–14, isolation means to selectively isolate electrical circuits without physically moving any of the boards for purposes of testing while other electrical circuits are functioning and maintaining means for maintaining board 14 in position on boards 11–13. Board 14 may, if desired, be secured to the instrument chassis.

It will be obvious to those having ordinary skill in the art that many changes may be made in the details of the above-described preferred embodiment of the present invention without departing from the spirit of the invention. Therefore, the scope of the present invention should only be determined by the following claims.

The invention is claimed in accordance with the following:

1. Electrical connecting means for connecting circuit means on adjacent support means carrying the circuit means comprising:

first electrical connector means on first dielectric support means having first electrical circuit means thereon, said first electrical connector means electrically connected to said first electrical circuit means;

second electrical connector means on second dielectric support means having second electrical circuit means thereon, said second electrical connector means electrically connected to said second electrical circuit means;

said first and second electrical connector means being in alignment when said first and second support means are disposed adjacent one another;

and a plurality of contact means including dielectric carrier means and a plurality of isolated pin means carried by said carrier means extending outwardly from said carrier means, said pin means mateably engaged with respectively aligned first and second electrical connector means electrically connecting same and said electrical circuit means and to enable one of said support means to be moved away from the other of said support means upon removal of said contact means from said aligned first and second electrical connector means and to selectively remove said contact means from said aligned first and second electrical connector means thereby isolating selective ones of said circuit means.

2. Electrical connecting means according to claim 1 wherein said first electrical connector means extend parallel with said first support means and said electrical connector means are perpendicular with said second support means.

3. Electrical connecting means according to claim 1 wherein said contact means have comb-shaped configuration.

4. Electrical connecting means according to claim 1 wherein said first electrical connector means are disposed in dielectric housing means.

* * * * *